United States Patent
Hsu

(10) Patent No.: US 10,412,856 B2
(45) Date of Patent: Sep. 10, 2019

(54) FAN DETECTION METHOD, FAN DETECTION CHIP AND FAN DETECTION SYSTEM USING THE SAME

(71) Applicant: NUVOTON TECHNOLOGY CORPORATION, Hsinchu (TW)

(72) Inventor: Shih-Hsuan Hsu, Taoyuan (TW)

(73) Assignee: NUVOTON TECHNOLOGY CORPORATION, Hsinchu (TW)

(*) Notice: Subject to any disclaimer, the term of this patent is extended or adjusted under 35 U.S.C. 154(b) by 2 days.

(21) Appl. No.: 15/924,839

(22) Filed: Mar. 19, 2018

(65) Prior Publication Data

US 2019/0045660 A1    Feb. 7, 2019

(30) Foreign Application Priority Data

Aug. 2, 2017 (TW) .............................. 106126153 A

(51) Int. Cl.
*H05K 7/20* (2006.01)
*G06F 1/20* (2006.01)

(52) U.S. Cl.
CPC ......... *H05K 7/20209* (2013.01); *G06F 1/206* (2013.01)

(58) Field of Classification Search
CPC ........ H02P 7/00; H02P 7/0038; H02P 7/0044; H02P 7/0066; H02P 7/06; H02P 7/2805; H02P 7/281; H02P 7/29; H02P 27/08; H02P 1/00; H02P 6/00; H02P 23/00; H02P 27/00; H02P 4/00; H02P 5/00; G05B 11/28; G06F 1/203; G06F 1/20; G06F 1/206

USPC ....... 361/679.46, 679.48, 676, 831; 165/214, 165/244; 700/300; 318/471, 472, 473, 318/400.01, 700, 701, 727, 599, 799, 811
See application file for complete search history.

(56) References Cited

U.S. PATENT DOCUMENTS

| | | | |
|---|---|---|---|
| 7,199,542 B1* | 4/2007 | Chen | G05B 11/28 318/473 |
| 7,313,466 B2* | 12/2007 | Chang | G06F 1/20 361/679.48 |
| 8,368,338 B2* | 2/2013 | Shen | G06F 1/20 318/471 |

* cited by examiner

*Primary Examiner* — Antony M Paul
(74) *Attorney, Agent, or Firm* — Muncy, Geissler, Olds & Lowe, P.C.

(57) ABSTRACT

A fan detection method, a fan detection chip and a fan detection system using the same are disclosed. The fan detection method is applied to a fan detection chip including a first pin, a second pin, a third pin, a fourth pin, and the fan is electrically coupled to the first pin, the second pin and the third pin at least. The fan detection method includes following steps: controlling a switch to selectively conduct the first pin and the second pin; controlling a pulse width modulation (PWM) signal processing module to output a voltage pulse to the fourth pin; detecting, by the voltage detection module, a voltage level on the fourth pin; and determining the fan to be a PWM fan when the voltage level is changed, and determining the fan to be a DC fan when the voltage level is not changed.

19 Claims, 5 Drawing Sheets

FAN DETECTION METHOD, FAN DETECTION CHIP AND FAN DETECTION SYSTEM USING THE SAME

CROSS-REFERENCE TO RELATED APPLICATION

This application claims priority to Taiwan Patent Application No. 106126153, filed on Aug. 2, 2017, in the Taiwan Intellectual Property Office, the disclosure of which is incorporated herein in its entirety by reference.

BACKGROUND OF THE INVENTION

1. Field of the Invention

The present disclosure relates to a fan detection method, and more particularly to a fan detection method for determining a type of a fan according to a change in a voltage on a pin, and a fan detection chip and a fan detection system using the same.

2. Description of the Related Art

In order to prevent a processor and other electronic devices disposed on the motherboard of a PC from being damaged subject to an excessively high temperature, the general PC usually includes a fan to dissipate heat generated by the processor and the electronic devices. There are two types of fans available in market, one is a three-wire DC fan, and the other is a four-wire PWM fan, and each of these fans is able to adjust revolving speed thereof to improve heat dissipation efficiency. The DC fan includes three pins and the revolving speed thereof can be controlled by adjusting power-supply voltage. The PWM fan includes four pins including a power signal terminal and a PWM control terminal, and the revolving speed of the PWM fan can be controlled by adjusting a duty cycle of the PWM signal inputted to the PWM control terminal of the PWM fan, and a fixed voltage is usually applied on the power signal terminal. The DC fan and the PWM fan are different from each other in the number of pins and driving manner, but general users may not understand which type of the fan is suitable for the driver chip on the motherboard, and wrong type of the fan may not be operated normally on the motherboard. For this reason, it is important to determine the type of the fan first and drive the fan by a correct manner.

There are two conventional methods of detecting the type of the fan, and the first method is to determine the type of the fan by using the voltage on the fourth pin generated by a pull-up resistor inside the driver chip for the PWM fan after the PWM fan is supplied with power. However, if the PWM fan includes a pull-down resistor only on the pin without the pull-up resistor, or includes an ESD diode only, the first method possibly misdetermines the type of the fan. The second method is to adjust the duty cycle of the PWM signal and then determine the type of the fan according to a change in fan speed after the fan is supplied with power, and when the fan speed changes along with the duty cycle, the fan is determined to be the PWM fan. The second method is able to correctly determine the type of the fan, but there are certain limitations of the second method that have prohibited its widespread use. One of the limitations is that the change in the fan speed is slower relative to the change in the duty cycle of the PWM signal, so the second method costs longer determination time; furthermore, the fan must be supplied with highest voltage to rotate in full speed during detection in the second method, so it also causes noise in the second method. As a result, the first method has disadvantages that the fan must be supplied with power first to rotate to a certain revolving speed for fan type determination, and the second method has disadvantages in longer determination time and noise.

A challenge, then, is to develop a fan detection method, a fan detection chip and a fan detection system to solve above-mentioned problem of the conventional detection method.

SUMMARY OF THE INVENTION

In order to solve above-mentioned problem of longer detection time and noise during fan detection process, the present disclosure is to provide a fan detection method, a fan detection chip and a fan detection system using the same, so that the type of the fan can be determined before the fan is rotated and the fan can be correctly controlled according to the determination result.

According to an embodiment, the present disclosure provides a fan detection method applied to a fan detection chip for detecting a type of a fan. Pins of the fan detection chip are electrically connected to pins of the fan. The fan detection method includes following steps: conducting a first pin and a second pin of the pins of the fan detection chip; outputting a voltage pulse to from a fourth pin of the pins of the fan detection chip; detecting a voltage level on the fourth pin of the pins of the fan detection chip; and determining the fan to be a PWM fan when the voltage level is changed, and determining the fan to be a DC fan when the voltage level is not changed.

Preferably, the voltage pulse includes a positive voltage pulse formed by a pull-up resistor of the fan detection chip.

Preferably, the voltage pulse includes a negative voltage pulse formed by a negative voltage circuit of the fan detection chip.

Preferably, after the type of the fan is determined, the fan detection method includes steps: transmitting, from the voltage detection module, a determination signal to the control module; and controlling, by the control module, the switch and a power supply module to provide a driving voltage to a power signal terminal of the fan through the second pin, to drive the fan to rotate.

Preferably, when the fan is determined to be the PWM fan, the PWM signal processing module transmits a PWM signal to a PWM signal terminal of the fan through the fourth pin, so as to control a revolving speed of the PWM fan by the PWM signal.

Preferably, when the fan is determined to be the DC fan, the PWM signal processing module converts a PWM signal into a voltage control signal, and transmits the voltage control signal to the power supply module, so as to adjust the driving voltage provided by the power supply module to the DC fan, and further control a revolving speed of the fan.

Preferably, the fan detection method further includes a step of stopping conduction between the first pin and the second pin of the fan detection chip after the type of the fan is determined.

According to an embodiment, the present disclosure provides a fan detection chip which is applied to detect a type of a fan. The fan detection chip incudes a first pin, a second pin, a third pin, a fourth pin, a switch, a control module, a voltage detection module, and a PWM signal processing module. The first pin is electrically coupled to a ground terminal of the fan, the second pin is electrically coupled to a power signal terminal of the fan, and the third pin is electrically coupled to a speed signal terminal of the fan. The fourth pin is selectively electrically coupled to a PWM signal terminal of the fan. The switch is electrically coupled between the first pin and the second pin. The control module is configured to control the switch. The voltage detection module is disposed between the control module and the fourth pin and configured to detect a voltage level on the fourth pin. The PWM signal processing module is electrically coupled to the fourth pin and the control module. During a fan detection process, the control module controls the switch to conduct the first pin and the second pin, and controls the PWM signal processing module to output a voltage pulse to the fourth pin, and the voltage detection module then detect whether the voltage level on the fourth pin is changed, and when the change in the voltage level on the fourth pin is detected, the fan is determined to be a PWM fan, and when no change in the voltage level on the fourth pin is detected, the fan is determined to be a DC fan.

Preferably, the fan detection chip further includes a pull-up resistor disposed between the PWM signal processing module and the fourth pin, and the voltage pulse is pulled up by the pull-up resistor to form a positive voltage pulse which is outputted to the fourth pin.

Preferably, the fan detection chip further includes a negative voltage circuit disposed between the PWM signal processing module and the fourth pin, and the negative voltage circuit outputs a negative voltage pulse to the fourth pin according to the voltage pulse.

Preferably, the fan detection chip further includes a power supply module electrically coupled to the second pin and the control module, and after the type of the fan is determined, the control module controls the switch and the power supply module to conduct the second pin with the power signal terminal, and the power supply module provides a driving voltage to drive the fan to rotate.

Preferably, the PWM signal processing module transmits a PWM signal to the PWM signal terminal through the fourth pin, so as to control a revolving speed of the PWM fan by the PWM signal.

Preferably, the PWM signal processing module converts a PWM signal into a voltage control signal, and transmits the voltage control signal to the power supply module to adjust the driving voltage provided by the power supply module, so as to adjust a revolving speed of the DC fan.

According to an embodiment, the present disclosure provides a fan detection system includes a fan and a fan detection chip. The fan includes a ground terminal, a power signal terminal and a speed signal terminal, and selectively comprising a PWM signal terminal. The fan detection chip includes a first pin, a second pin, a third pin, a fourth pin, a switch, a control module, a voltage detection module, and a PWM signal processing module. The first pin is electrically coupled to the ground terminal, and the second pin is electrically coupled to the power signal terminal, and the third pin is electrically coupled to the speed signal terminal. The switch is electrically coupled between the first pin and the second pin. The voltage detection module is disposed between the control module and a fourth pin, and configured to detect a voltage level on the fourth pin, wherein the fourth pin is selectively electrically coupled to the PWM signal terminal. The PWM signal processing module is electrically coupled to the fourth pin and the control module. The control module is configured to control the switch and the PWM signal processing module. During a fan detection process, the control module controls the switch to conduct the first pin and the second pin, and controls the PWM signal processing module to output a voltage pulse to the fourth pin, and the voltage detection module then detects whether the voltage level on the fourth pin is changed, and the fan is determined to be a PWM fan when the change in the voltage level is detected, and the fan is determined to be a DC fan when no changed in the voltage level is detected.

Preferably, the fan detection chip further includes a pull-up resistor disposed between the PWM signal processing module and the fourth pin, and the voltage pulse is pulled up by the pull-up resistor to form a positive voltage pulse which is outputted to the fourth pin.

Preferably, the fan detection chip further includes a negative voltage circuit disposed between the PWM signal processing module and the fourth pin, and the negative voltage circuit outputs a negative voltage pulse to the fourth pin according to the voltage pulse.

Preferably, the fan detection chip further includes a power supply module electrically coupled to the second pin and the control module, and after the type of the fan is determined, the control module controls the switch and the power supply module to conduct the second pin with the power signal terminal, and the power supply module provides a driving voltage to drive the fan to rotate.

Preferably, the PWM signal processing module transmits a PWM signal to the PWM signal terminal through the fourth pin, so as to control a revolving speed of the PWM fan by the PWM signal.

Preferably, the PWM signal processing module converts a PWM signal into a voltage control signal, and transmits the voltage control signal to the power supply module to adjust the driving voltage provided by the power supply module, so as to adjust a revolving speed of the DC fan.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
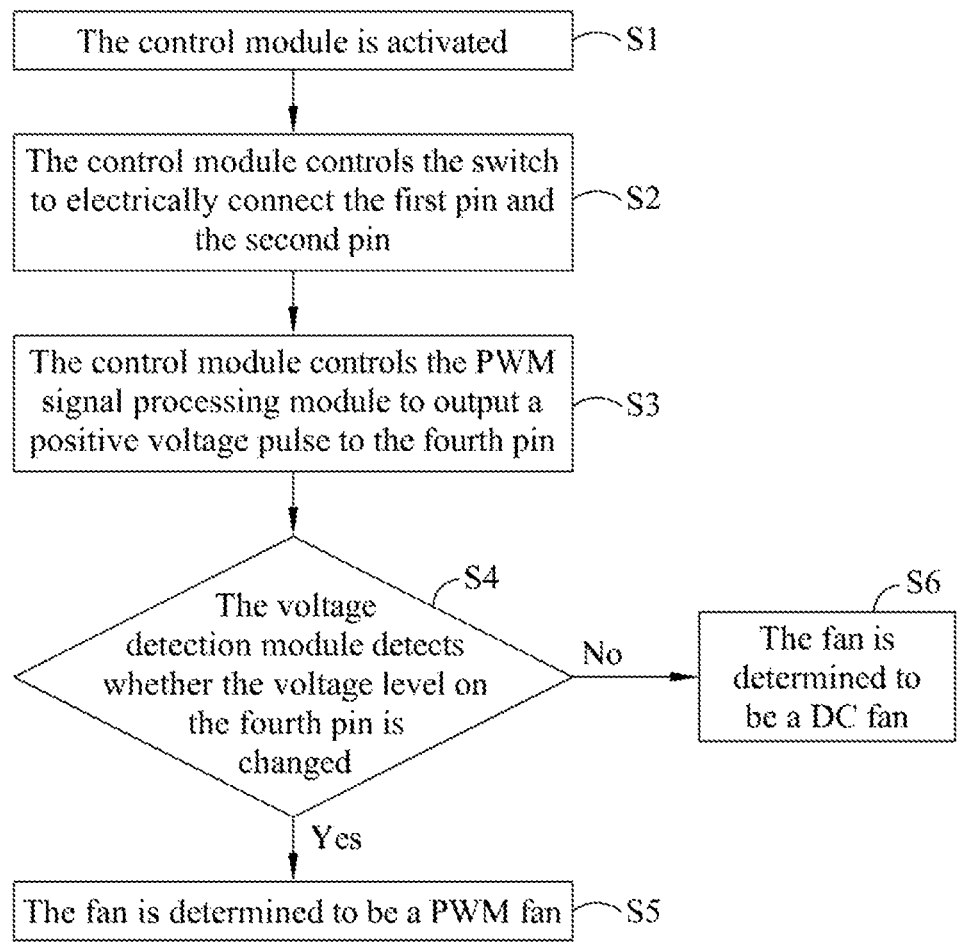
FIG. 1 is a flowchart showing the steps in an operation of an embodiment of a fan detection method of the present disclosure.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present invention. As used herein, the term "or" includes any and all combinations of one or more of the associated listed items.

Figure 2:
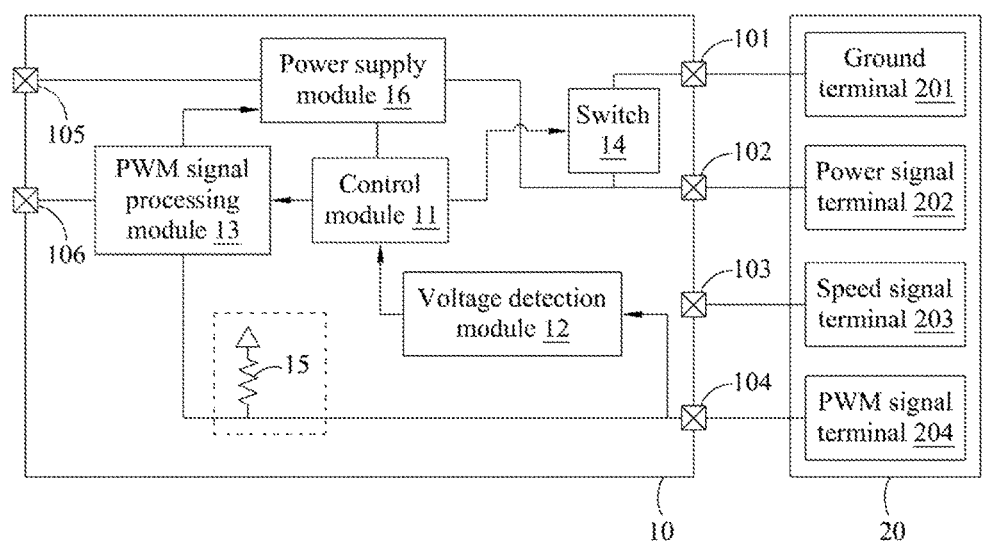
FIG. 2 is a block diagram of an embodiment of a fan detection system of the present disclosure.

The following refers to FIGS. 1 and 2. FIG. 1 is a flowchart showing the steps in an operation of an embodiment of a fan detection method of the present disclosure, and FIG. 2 is a schematic view of an embodiment of a fan detection system of the present disclosure. The fan detection system includes a fan detection chip 10 and a fan 20 coupled to the fan detection chip 10. A type of the fan 20 is unknown when the fan 20 is being coupled to the fan detection chip 10, and the fan detection chip 10 is configured to determine the type of the fan 20 first and then drive the fan 20 to rotate by a correct control manner. In this embodiment, a pulse width modulation (PWM) fan with four pins is taken as an example for the fan 20, so the fan 20 includes a ground terminal 201, a power signal terminal 202, a speed signal terminal 203 and a PWM signal terminal 204. The fan detection chip 10 includes a first pin 101, a second pin 102, a third pin 103 and a fourth pin 104. The first pin 101 is electrically coupled to the ground terminal 201, the second pin 102 is electrically coupled to the power signal terminal 202, the third pin 103 is electrically coupled to the speed signal terminal 203, and the fourth pin 104 is electrically coupled to the PWM signal terminal 204. In other embodiment, when a DC fan with three pins is taken as an example for the fan 20, the fan 20 does not include the PWM signal terminal 204, and the fourth pin 104 of the fan detection chip 10 is floating. As a result, in the coupling relationship between the fan detection chip 10 and the fan 20, the fourth pin 104 of the fan detection chip 10 is selectively coupled to the PWM signal terminal 204.

Besides, the fan detection chip 10 can include a control module 11, a voltage detection module 12, a PWM signal processing module 13 and a switch 14. The switch 14 is electrically coupled between the first pin 101 and the second pin 102, and the control module 11 controls the switch 14, and configured to control connection state between the first pin 101 and the second pin 102. The voltage detection module 12 is disposed between the control module 11 and the fourth pin 104, and configured to detect a voltage level on the fourth pin 104. The PWM signal processing module 13 is electrically coupled to the control module 11 and the fourth pin 104, and the control module 11 controls the PWM signal processing module 13 to output a voltage pulse of a PWM signal to the fourth pin 104.

FIG. 1 shows a flowchart showing the steps S1 to S6 in an operation of the method that the fan detection chip 10 detects type of the fan 20.

In a step S1, the control module is activated. The type of the fan 20 is unknown when the fan detection chip 10 and the fan 20 are coupled to each other or the system is activated, so the fan detection chip 10 performs the following steps to determine the type of the fan 20 after being activated.

In a step S2, the control module controls the switch to electrically connect the first pin and the second pin. After being activated, the control module 11 transmits a control signal to turn on the switch 14, thereby electrically connecting the first pin 101 and the second pin 102.

In a step S3, the control module controls the PWM signal processing module to output a positive voltage pulse to the fourth pin. The control module 11 of the fan detection chip 10 controls the PWM signal processing module 13 to output a voltage pulse of the PWM signal to the fourth pin 104; in this embodiment, a pull-up resistor 15 is disposed between the PWM signal processing module 13 and the fourth pin 104, and configured to pull up the voltage level of the PWM signal, so as to facilitate to transmit the positive voltage pulse to the fourth pin 104.

In a step S4, the voltage detection module detects whether the voltage level on the fourth pin is changed. After the positive voltage pulse is transmitted to the fourth pin 104, the voltage detection module 12 detects the voltage level on the fourth pin 104 of the fan detection chip 10; for example, the voltage detection module 12 may include a comparator circuit to compare the voltage on the fourth pin 104 with a reference voltage, and the voltage detection module 12 determines whether the voltage level on the fourth pin 104 is changed according to a comparison result, and transmit a determination result to the control module 11. In the step S4, if it is determined that the voltage level on the fourth pin is changed, the method proceeds a step S5; otherwise, the method proceeds a step S6.

In the step S5, the fan is determined to be a PWM fan. When the fan 20 is the PWM fan, the voltage level on the fourth pin 104 can be changed after the positive voltage pulse is applied to the pull-up resistor or a pull-down resistor of the fan detection chip 10, so that the fan 20 is determined to be the PWM fan when the voltage detection module 12 detects the change in the voltage level.

In the step S6, the fan is determined to be a DC fan. When the fan 20 is the DC fan, the fourth pin 104 is floating because of no corresponding pin provided in the fan 20, so the positive voltage pulse transmitted from the fan detection chip 10 does not affect the voltage level on the fourth pin 104. As a result, when the voltage detection module 12 does not detect the change in the voltage level, the fan 20 can be determined to be the DC fan.

Figure 3:
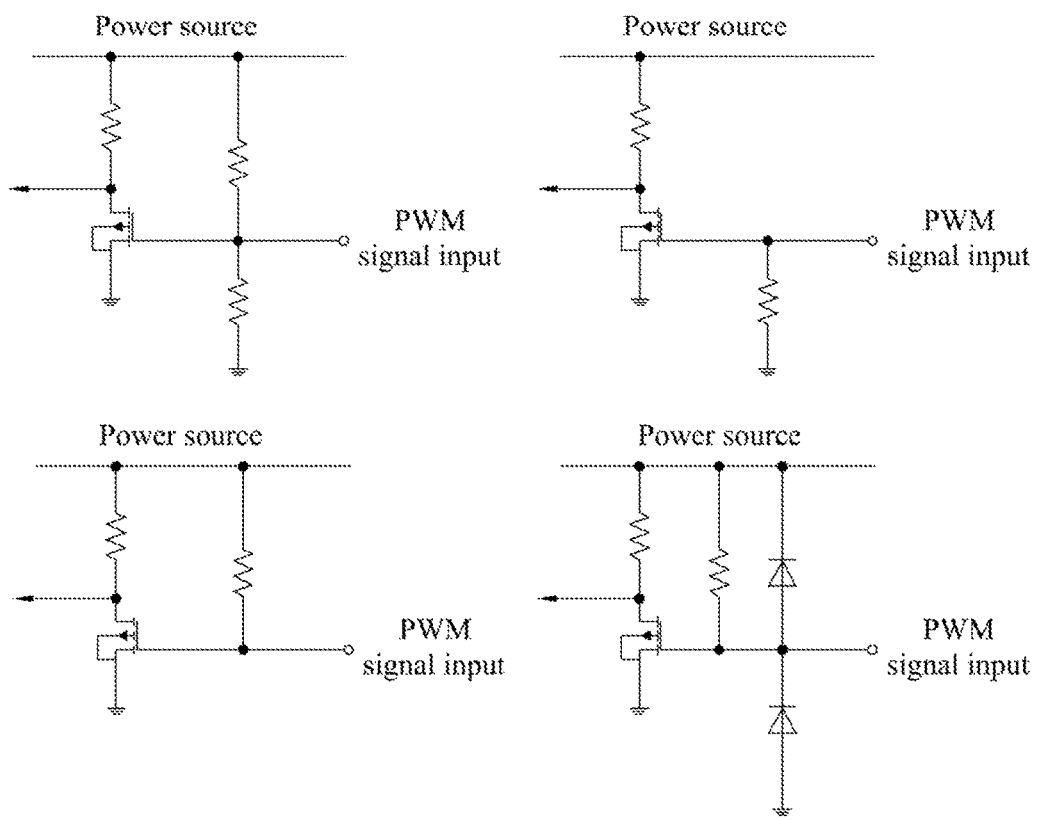
FIG. 3 is a circuit diagram of PWM signal input of a PWM fan.

The following describes a scheme of determining the fan 20 to be the PWM fan or the DC fan. Please refer to FIG. 3, which is a circuit diagram of PWM signal input of the PWM fan. It should be noted that a circuit shown in a dashed line block of FIG. 2 can be replaced by one of circuits shown in FIG. 3. As shown in FIG. 3, the fan detection chip may include one of four circuits, such as a circuit (shown in top left part of FIG. 3) including a pull-up resistor and a pull-down resistor, a circuit (shown in in top right part of FIG. 3) including a pull-down resistor, a circuit (shown in bottom left part of FIG. 3) including a pull-up resistor, and a circuit (shown in bottom right part of FIG. 3) including an ESD diode. The PWM fan is usually provided with a fixed power and adjusts a fan speed thereof by a duty cycle of the PWM signal. Before the fan is activated to rotate, when the voltage pulse is transmitted to the fourth pin which is electrically coupled to the fan, the voltage level of the fourth pin is changed correspondingly because of affect applied by the pull-up resistor, the pull-down resistor or the ESD diode; otherwise, if the fan 20 is the DC fan without the input pin for receiving the PWM signal, it indicate that the fourth pin of the fan detection chip is floating, so the voltage level on the fourth pin is not changed when the voltage pulse is transmitted to the fourth pin.

Furthermore, the fan detection chip 10 may further include a power supply module 16 electrically coupled to the second pin 102 and the control module 11, and electrically coupled to power supply through the supply input terminal 105. The power supply module 16 is configured to provide driving voltage to the fan 20 through the second pin 102. After the fan 20 is determined to be the PWM fan in the step S5, the determination result can be transmitted to the control module 11, and the control module 11 then turns off the switch 14 to isolate the first pin 101 from the second pin 102, so that the power supply module 16 can provide power to the PWM fan through the second pin 102. At this time, the PWM signal processing module 13 can be coupled to the PWM signal input terminal 106, and after receiving an external command, the PWM signal processing module 13 generates the PWM signal for controlling a revolving speed of the fan 20, and transmits the PWM signal to the PWM signal terminal 204 through the fourth pin 104, thereby controlling the PWM fan to rotate in a desired revolving speed according to the duty cycle of the PWM signal.

When the fan 20 is determined to be the DC fan in the step S6, the control module 11 also turn off the switch 14 to isolate the first pin 101 from the second pin 10. The PWM signal processing module 13 can convert the PWM signal into a voltage control signal and transmit the voltage control signal to the power supply module 16, so as to control the driving voltage provided to the power signal terminal 202. As a result, the revolving speed of the DC fan can be adjusted by changing the driving voltage.

Figure 4:
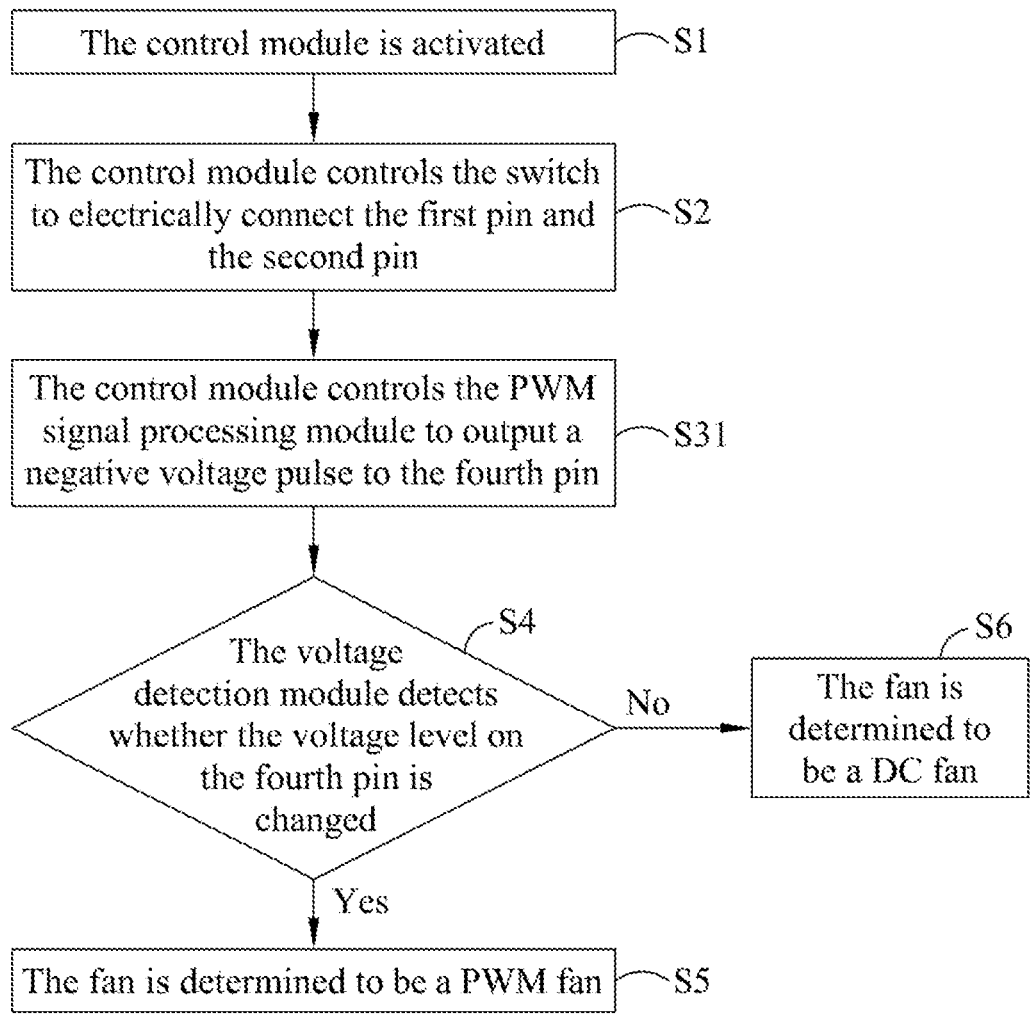
FIG. 4 is a flowchart showing the steps in an operation of other embodiment of the fan detection method of the present disclosure.
Figure 5:
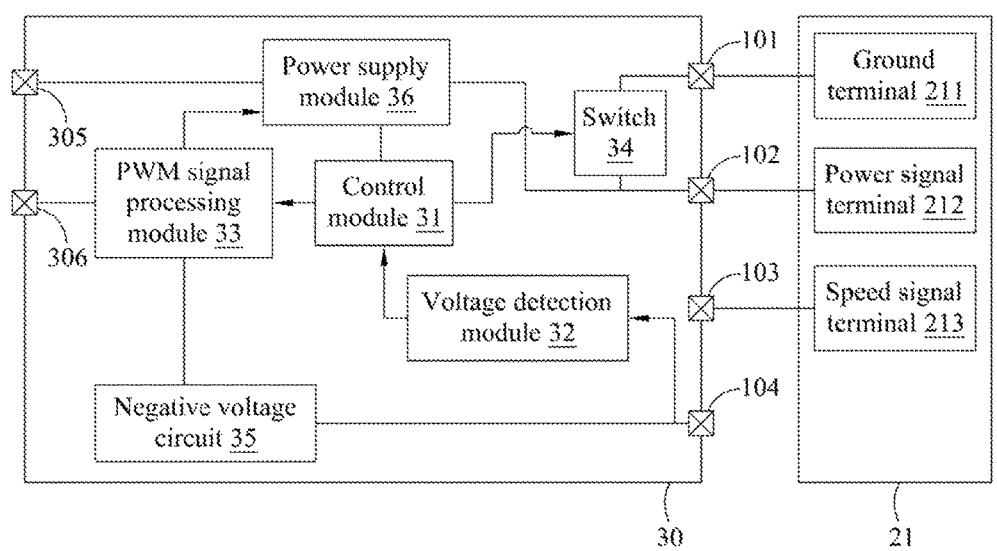
FIG. 5 is a block diagram of other embodiment of the fan detection system of the present disclosure.

The following refers to FIGS. 4 and 5. FIG. 4 is a flowchart showing the steps in an operation of other embodiment of the fan detection method of the present disclosure, and FIG. 5 is a schematic view of other embodiment of the fan detection system of the present disclosure. In this embodiment, the fan detection system includes a fan detection chip 30 and a fan 21 electrically coupled to the fan detection chip 30, and the fan 21 is the DC fan including a ground terminal 211, a power signal terminal power signal terminal and a speed signal terminal 213. Compared with the embodiment of FIG. 2, the fan 21 does not include the PWM signal terminal. The fan detection chip 30 includes a first pin 301, a second pin 302, a third pin 303, a fourth pin 304, a supply input terminal 305 and a PWM signal input terminal 306. The first pin 301 is electrically coupled to the ground terminal 211, the second pin 302 is electrically coupled to the power signal terminal 212, and the third pin 303 is electrically coupled to the speed signal terminal 213. The DC fan does not include the PWM signal terminal, so the fourth pin 304 is floating. The fan detection chip 30 includes a control module 31, a voltage detection module 32, a PWM signal processing module 33, a switch 34 and a power supply module 36, and the functions of these components are similar to that of the embodiment of FIG. 2, so their descriptions are not repeated. The main difference between the fan detection chip 30 of this embodiment and the fan detection chip of previous embodiment is that the fan detection chip 30 includes a negative voltage circuit 35 disposed between the PWM signal processing module 33 and the fourth pin 304. During fan detection process, the negative voltage circuit 35 generates and transmits a negative voltage pulse to the fourth pin 304.

FIG. 4 shows a flowchart showing the steps in an operation of the fan detection system of this embodiment. Among the steps shown in FIG. 4, only the step S31 is different from the step S3 of FIG. 1, and other steps are the same as that of FIG. 1. In the step S31, the control module controls the power supply module to output a negative voltage pulse to the fourth pin. In this embodiment, the fan detection chip 30 includes the negative voltage circuit 35, so the negative voltage pulse can be generated and transmitted to the fourth pin 304, and the voltage detection module 32 then detects whether the voltage level on the fourth pin 304 is changed. If the fan is the PWM pin, the fourth pin 304 is electrically coupled to the fan, so a pull-up resistor, a pull-down resistor or a protection circuit of PWM fan may cause the change in the voltage level of the fourth pin 304 subject to the negative voltage pulse. As a result, after the change in the voltage level on the fourth pin 304 is detected, the fan 21 can be determined to be the PWM fan. Otherwise, when there is no change in the voltage level on the fourth pin 21, the fan 21 can be determined to be the DC fan. In this embodiment, the fourth pin 304 is floating, so the voltage detection module 32 detects absence of voltage change on the fourth pin 21 after the negative voltage pulse is transmitted to the fourth pin 304, and the fan 21 can be determined to be the DC fan. According to determination result, the fan can be driven and the revolving speed thereof can be controlled by the correct manner. After the fan is determined to be the PWM fan, the PWM signal is transmitted to the PWM signal terminal, and the revolving speed of the fans can be adjusted according to the duty cycle of the PWM signal. After the fan is determined to be the DC fan, the PWM signal is converted into a voltage control signal which is used to control the driving voltage provided by the power supply module, thereby controlling the revolving speed of the fan.

Furthermore, the fan detection chip 30 can include a tachometer electrically coupled to the speed signal terminal 203 of the fan 20 through the second pin 302. The tachometer can receive an output signal associated with the actual rotational speed of the fan 21 during rotation, and then transmits the output signal to the control module 31, thereby facilitating to monitor practical operation condition of the fan 21. Furthermore, the fan detection chip 30 can include an over-current protection circuit, an over-temperature protection circuit, or a combination thereof. These protection circuits can be electrically coupled to the control module 31 and configured to monitor an operation status of the fan detection chip 30, so as to prevent the fan detection chip 30 from being damaged because of excessively high temperature or current. The components of above-mentioned embodiment of the fan detection chip can be implemented by digital circuits, analog circuits, or mixed circuits, or can be implemented by appropriate hardware device capable of executing the functions of above-mentioned components.

The present disclosure disclosed herein has been described by means of specific embodiments. However, numerous modifications, variations and enhancements can be made thereto by those skilled in the art without departing from the spirit and scope of the invention set forth in the claims.

What is claimed is:

1. A fan detection method, applied to a fan detection chip for detecting a type of a fan, and wherein pins of the fan detection chip are electrically connected to pins of the fan, and the fan detection method comprises:
   conducting a first pin and a second pin of the pins of the fan detection chip;
   outputting a voltage pulse to from a fourth pin of the pins of the fan detection chip;
   detecting a voltage level on the fourth pin of the pins of the fan detection chip; and determining the fan to be a PWM fan when the voltage level is changed, and determining the fan to be a DC fan when the voltage level is not changed.

2. The fan detection method according to claim 1, wherein the voltage pulse comprises a positive voltage pulse formed by a pull-up resistor of the fan detection chip.

3. The fan detection method according to claim 1, wherein the voltage pulse comprises a negative voltage pulse formed by a negative voltage circuit of the fan detection chip.

4. The fan detection method according to claim 1, after the type of the fan is determined, further comprising:
generating a determination signal to a control module of the fan detection chip; and
controlling, by the control module, a switch and a power supply module to provide a driving voltage to a power signal terminal of the fan through the second pin of the fan detection chip, to drive the fan to rotate.

5. The fan detection method according to claim 4, wherein when the fan is determined to be the PWM fan, a PWM signal processing module of the fan detection chip transmits a PWM signal to a PWM signal terminal of the fan through the fourth pin of the fan detection chip, so as to control a revolving speed of the PWM fan by the PWM signal.

6. The fan detection method according to claim 4, wherein when the fan is determined to be the DC fan, a PWM signal processing module of the fan detection chip converts a PWM signal into a voltage control signal, and transmits the voltage control signal to a power supply module of the fan detection chip, so as to adjust the driving voltage provided by the power supply module to the DC fan, and further control a revolving speed of the fan.

7. The fan detection method according to claim 1, further comprising:
stopping conduction between the first pin and the second pin of the fan detection chip after the type of the fan is determined.

8. A fan detection chip, applied to detect a type of a fan, and the fan detection chip comprising:
a first pin electrically coupled to a ground terminal of the fan;
a second pin electrically coupled to a power signal terminal of the fan;
a third pin electrically coupled to a speed signal terminal of the fan;
a fourth pin selectively electrically coupled to a PWM signal terminal of the fan;
a switch electrically coupled between the first pin and the second pin;
a control module configured to control the switch;
a voltage detection module disposed between the control module and the fourth pin and configured to detect a voltage level on the fourth pin; and
a PWM signal processing module electrically coupled to the fourth pin and the control module;
wherein during a fan detection process, the control module controls the switch to conduct the first pin and the second pin, and controls the PWM signal processing module to output a voltage pulse to the fourth pin, and the voltage detection module then detect whether the voltage level on the fourth pin is changed, and when the change in the voltage level on the fourth pin is detected, the fan is determined to be a PWM fan, and when no change in the voltage level on the fourth pin is detected, the fan is determined to be a DC fan.

9. The fan detection chip according to claim 8, further comprising a pull-up resistor disposed between the PWM signal processing module and the fourth pin, and the voltage pulse is pulled up by the pull-up resistor to form a positive voltage pulse which is outputted to the fourth pin.

10. The fan detection chip according to claim 8, further comprising a negative voltage circuit disposed between the PWM signal processing module and the fourth pin, and the negative voltage circuit outputs a negative voltage pulse to the fourth pin according to the voltage pulse.

11. The fan detection chip according to claim 8, further comprising a power supply module electrically coupled to the second pin and the control module, and after the type of the fan is determined, the control module controls the switch and the power supply module to conduct the second pin with the power signal terminal, and the power supply module provides a driving voltage to drive the fan to rotate.

12. The fan detection chip according to claim 11, wherein the PWM signal processing module transmits a PWM signal to the PWM signal terminal through the fourth pin, so as to control a revolving speed of the PWM fan by the PWM signal.

13. The fan detection chip according to claim 11, wherein the PWM signal processing module converts a PWM signal into a voltage control signal, and transmits the voltage control signal to the power supply module to adjust the driving voltage provided by the power supply module, so as to adjust a revolving speed of the DC fan.

14. A fan detection system, comprising:
a fan comprising a ground terminal, a power signal terminal and a speed signal terminal, and selectively comprising a PWM signal terminal;
a fan detection chip, comprising:
a first pin, a second pin, a third pin and a fourth pin, wherein the first pin is electrically coupled to the ground terminal, and the second pin is electrically coupled to the power signal terminal, and the third pin is electrically coupled to the speed signal terminal;
a switch electrically coupled between the first pin and the second pin;
a voltage detection module disposed between the control module and a fourth pin, and configured to detect a voltage level on the fourth pin, wherein the fourth pin is selectively electrically coupled to the PWM signal terminal; and
a PWM signal processing module electrically coupled to the fourth pin and the control module;
a control module configured to control the switch and the PWM signal processing module;
wherein during a fan detection process, the control module controls the switch to conduct the first pin and the second pin, and controls the PWM signal processing module to output a voltage pulse to the fourth pin, and the voltage detection module then detects whether the voltage level on the fourth pin is changed, and the fan is determined to be a PWM fan when the change in the voltage level is detected, and the fan is determined to be a DC fan when no changed in the voltage level is detected.

15. The fan detection system according to claim 14, wherein the fan detection chip comprises a pull-up resistor disposed between the PWM signal processing module and the fourth pin, and the voltage pulse is pulled up by the pull-up resistor to form a positive voltage pulse which is outputted to the fourth pin.

16. The fan detection system according to claim 14, wherein the fan detection chip comprises a negative voltage circuit disposed between the PWM signal processing module and the fourth pin, and the negative voltage circuit outputs a negative voltage pulse to the fourth pin according to the voltage pulse.

17. The fan detection system according to claim 14, wherein the fan detection chip comprises a power supply module electrically coupled to the second pin and the control module, and after the type of the fan is determined, the control module controls the switch and the power supply module to conduct the second pin with the power signal terminal, and the power supply module provides a driving voltage to drive the fan to rotate.

18. The fan detection system according to claim 17, wherein the PWM signal processing module transmits a PWM signal to the PWM signal terminal through the fourth pin, so as to control a revolving speed of the PWM fan by the PWM signal.

19. The fan detection system according to claim 17, wherein the PWM signal processing module converts a PWM signal into a voltage control signal, and transmits the voltage control signal to the power supply module to adjust the driving voltage provided by the power supply module, so as to adjust a revolving speed of the DC fan.

* * * * *